United States Patent
Yokomizo et al.

(10) Patent No.: US 12,009,155 B2
(45) Date of Patent: Jun. 11, 2024

(54) MULTILAYER CERAMIC CAPACITOR

(71) Applicant: Murata Manufacturing Co., Ltd., Nagaokakyo (JP)

(72) Inventors: Satoshi Yokomizo, Nagaokakyo (JP); Shinobu Chikuma, Nagaokakyo (JP); Yohei Mukobata, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 28 days.

(21) Appl. No.: 17/489,881

(22) Filed: Sep. 30, 2021

(65) Prior Publication Data

US 2022/0108843 A1    Apr. 7, 2022

(30) Foreign Application Priority Data

Oct. 7, 2020   (JP) ................ 2020-169691

(51) Int. Cl.
*H01G 4/30*    (2006.01)
*H01G 2/06*    (2006.01)
*H01G 4/232*   (2006.01)
*H01G 4/248*   (2006.01)

(52) U.S. Cl.
CPC ............. *H01G 4/30* (2013.01); *H01G 2/06* (2013.01); *H01G 4/2325* (2013.01); *H01G 4/248* (2013.01)

(58) Field of Classification Search
None
See application file for complete search history.

(56) References Cited

U.S. PATENT DOCUMENTS

| | | | | |
|---|---|---|---|---|
| 9,799,453 | B2* | 10/2017 | Ahn | H01G 4/1227 |
| 10,062,511 | B1* | 8/2018 | Park | H05K 1/111 |
| 10,483,040 | B1* | 11/2019 | Kim | H01G 4/40 |
| 10,672,562 | B2* | 6/2020 | Kim | H05K 1/181 |
| 10,923,282 | B2* | 2/2021 | Kim | H01G 4/40 |
| 11,380,489 | B2* | 7/2022 | Yokomizo | H01G 2/065 |
| 2016/0093441 | A1* | 3/2016 | Ahn | H01G 2/065 |
| | | | | 361/301.4 |
| 2017/0042029 | A1* | 2/2017 | Nishimura | H01G 2/06 |
| 2018/0323010 | A1* | 11/2018 | Park | H01G 2/065 |
| 2019/0131076 | A1* | 5/2019 | Fukumura | H01G 4/232 |
| 2019/0279816 | A1* | 9/2019 | Taniguchi | H01G 4/228 |
| 2019/0287719 | A1* | 9/2019 | Fujita | H01G 4/232 |
| 2019/0362895 | A1* | 11/2019 | Kobayashi | H01G 4/2325 |

(Continued)

FOREIGN PATENT DOCUMENTS

WO    2015/098990 A1    7/2015

*Primary Examiner* — Dion R. Ferguson
(74) *Attorney, Agent, or Firm* — Keating & Bennett, LLP

(57) ABSTRACT

A multilayer ceramic capacitor includes a capacitor main body, and two interposers on both sides in a length direction of a surface of the capacitor main body. When a distance between a side surface of one interposer on one side in the length direction, and a side surface of the capacitor main body is defined as X1, a distance between another side surface of the one interposer, and another side surface of the capacitor main body is defined as X4, a distance between a side surface of another interposer on another side in the length direction, and the side surface of the capacitor main body is defined as X2, and a distance between another side surface of the other interposer on the other side in the length direction, and the other side surface of the capacitor main body is defined as X3; X2>X3 and X1>X4 are satisfied.

12 Claims, 11 Drawing Sheets

(56) References Cited

U.S. PATENT DOCUMENTS

| | | | | |
|---|---|---|---|---|
| 2019/0392991 A1* | 12/2019 | Harada | .................. | H01G 4/232 |
| 2020/0090870 A1* | 3/2020 | Kim | ........................ | H01G 2/06 |
| 2020/0126720 A1* | 4/2020 | Son | ........................ | H01G 4/224 |
| 2020/0343048 A1* | 10/2020 | Yokomizo | ................ | H01G 4/30 |
| 2021/0337669 A1* | 10/2021 | Yokomizo | .............. | H01G 4/232 |
| 2022/0108843 A1* | 4/2022 | Yokomizo | .............. | H01G 4/232 |

* cited by examiner

FIG. 4

| | TYPE A | TYPE B | TYPE C |
|---|---|---|---|
| DIMENSION IN LENTH DIRECTION L (mm) | 0.95~1.15 | 1.62~1.72 | 1.81~2.01 |
| DIMENSION IN WIDTH DIRECTION W (mm) | 0.62~0.68 | 0.88~0.96 | 1.29~1.49 |
| DIMENSION IN THICKNESS DIRECTION T (mm) | 0.62~0.68 | 0.89~0.97 | 1.32~1.42 |
| DIMENSION IN LAMINATION DIRECTION T OF DIELECTRIC LAYER (μm) | 0.98~1.09 | 1.35~1.45 | 1.88~1.96 |
| DIMENSION IN LAMINATION DIRECTION T OF INTERNAL ELECTRODE LAYER (μm) | 0.62~0.68 | 0.67~0.77 | 0.73~0.86 |
| NUMBER OF EACH OF DIELECTRIC LAYERS AND INTERNAL ELECTRODE LAYERS | 350~380 | 386~426 | 440~490 |
| DIMENSION IN LAMINATION DIRECTION T OF OUTER LAYER PORTION (μm) | 17~23 | 35~45 | 52~63 |
| DEVIATION AMOUNT IN LENGTH DIRECTION L OF INTERNAL ELECTRODE LAYER (μm) | 45~48 | 72~78 | 72~85 |
| DIMENSION IN WIDTH DIRECTION W OF SIDE GAP PORTION (μm) | 32~42 | 52~62 | 63~75 |

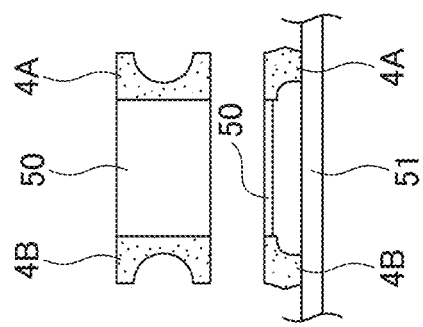
FIG. 8A
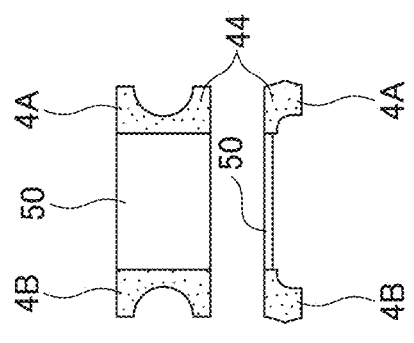
FIG. 8B
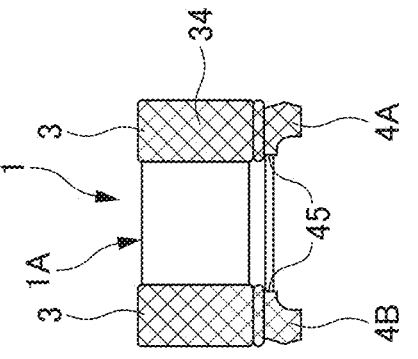
FIG. 8E
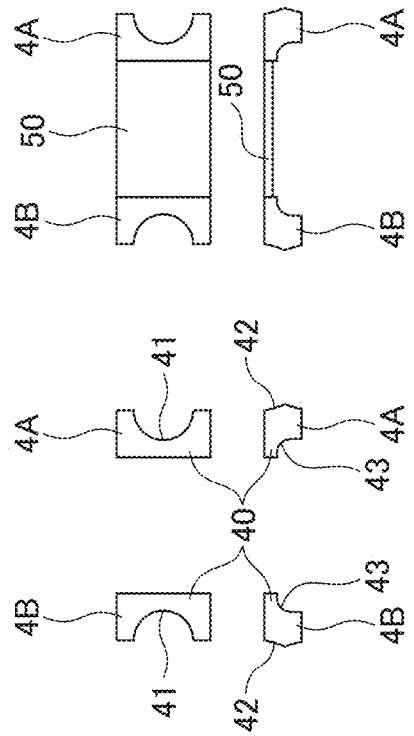
FIG. 8C / FIG. 8D
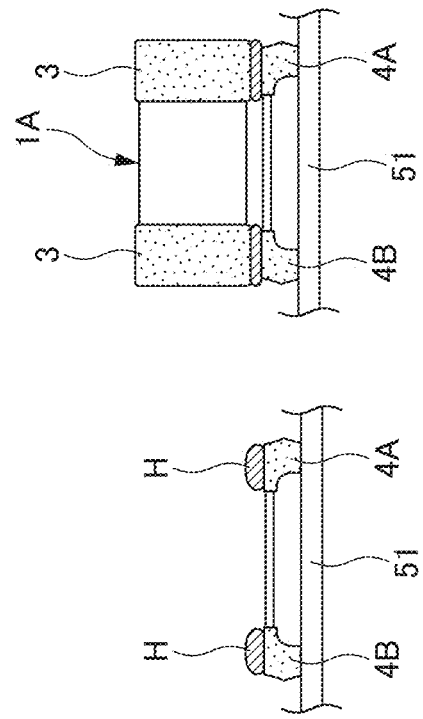
FIG. 8F / FIG. 8G / FIG. 8H

MULTILAYER CERAMIC CAPACITOR

CROSS REFERENCE TO RELATED APPLICATIONS

This application is based on and claims the benefit of priority from Japanese Patent Application 2020-169691, filed on Oct. 7, 2020, the entire contents of which are incorporated herein by reference.

BACKGROUND OF THE INVENTION

1. Field of the Invention

The present invention relates to a multilayer ceramic capacitor.

2. Description of the Related Art

Recently, a large capacitance, small multilayer ceramic capacitor has been demanded. Such a multilayer ceramic capacitor has an inner layer portion in which the dielectric layers including a ferroelectric material of relatively high dielectric constant, and the inner electrodes are alternately laminated.

Furthermore, dielectric layers serving as outer layer portions are formed on the upper and lower portions of the inner layer portion, thereby providing a rectangular parallelepiped multilayer body, and external electrodes are provided on both end surfaces in the length direction of the multilayer body, thereby forming a capacitor main body.

Furthermore, in order to suppress or prevent the generation of "acoustic noise", a multilayer ceramic capacitor has been known which includes an interposer provided on the side of the capacitor main body mounted on a board (refer to PCT International Publication No. WO2015/098990).

Here, depending on the application, when mounted on a board, it may be necessary to identify the orientation of the multilayer ceramic capacitor.

SUMMARY OF THE INVENTION

Preferred embodiments of the present invention provide multilayer ceramic capacitors in each of which the orientation of the multilayer ceramic capacitor is identifiable when mounted on a board.

A preferred embodiment of the present invention provides a multilayer ceramic capacitor that includes a capacitor main body including a multilayer body including dielectric layers and internal electrode layers alternately laminated therein, and external electrodes each at one of two end surfaces of the multilayer body and connected to the internal electrode layers, and two interposers on both sides in a length direction of a surface of the capacitor main body, wherein, when a distance between a side surface in a width direction of one of the interposers on one side in the length direction, and a side surface in the width direction of the capacitor main body is defined as X1, a distance between another side surface in the width direction of the one of the interposers on the one side in the length direction, and another side surface in the width direction of the capacitor main body is defined as X4, a distance between a side surface in the width direction of another one of the interposers on another side in the length direction, and the side surface in the width direction of the capacitor main body is defined as X2, and a distance between another side surface in the width direction of the another one of the interposers on the other side in the length direction, and the other side surface in the width direction of the capacitor main body is defined as X3, X2>X3 and X1>X4 are satisfied.

According to preferred embodiments of the present invention, it is possible to provide multilayer ceramic capacitors in each of which the orientation of the multilayer ceramic capacitor is identifiable when mounted on a board.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 4 is a table showing favorable ranges for each of the types of a capacitor main body 1A according to a preferred embodiment of the present invention.

FIGS. 8A to 8H provide diagrams illustrating an interposer mounting step S3.

DETAILED DESCRIPTION OF THE PREFERRED EMBODIMENTS

Figure 1:
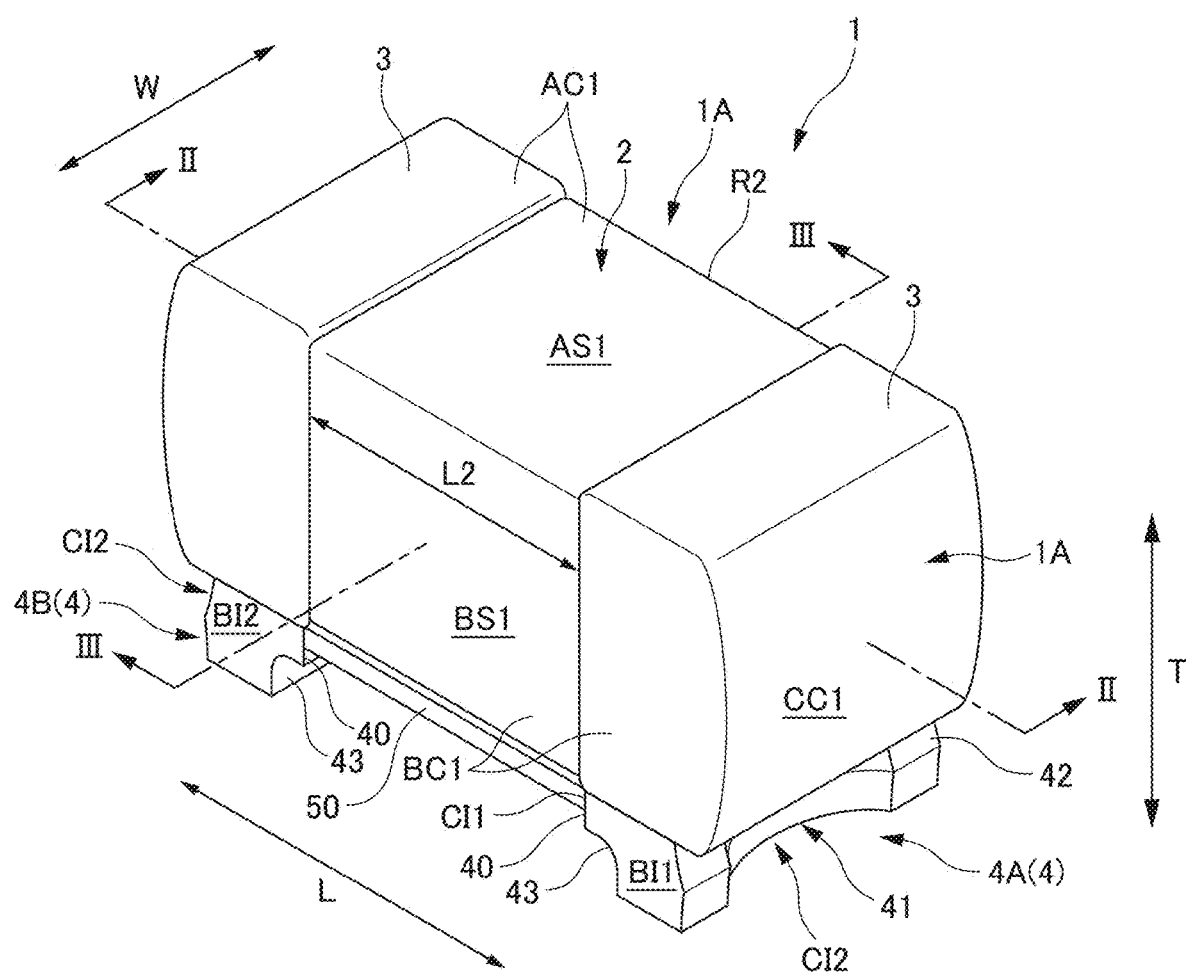
FIG. 1 is a schematic perspective view of a multilayer ceramic capacitor 1 according to a preferred embodiment of the present invention.
Figure 2:
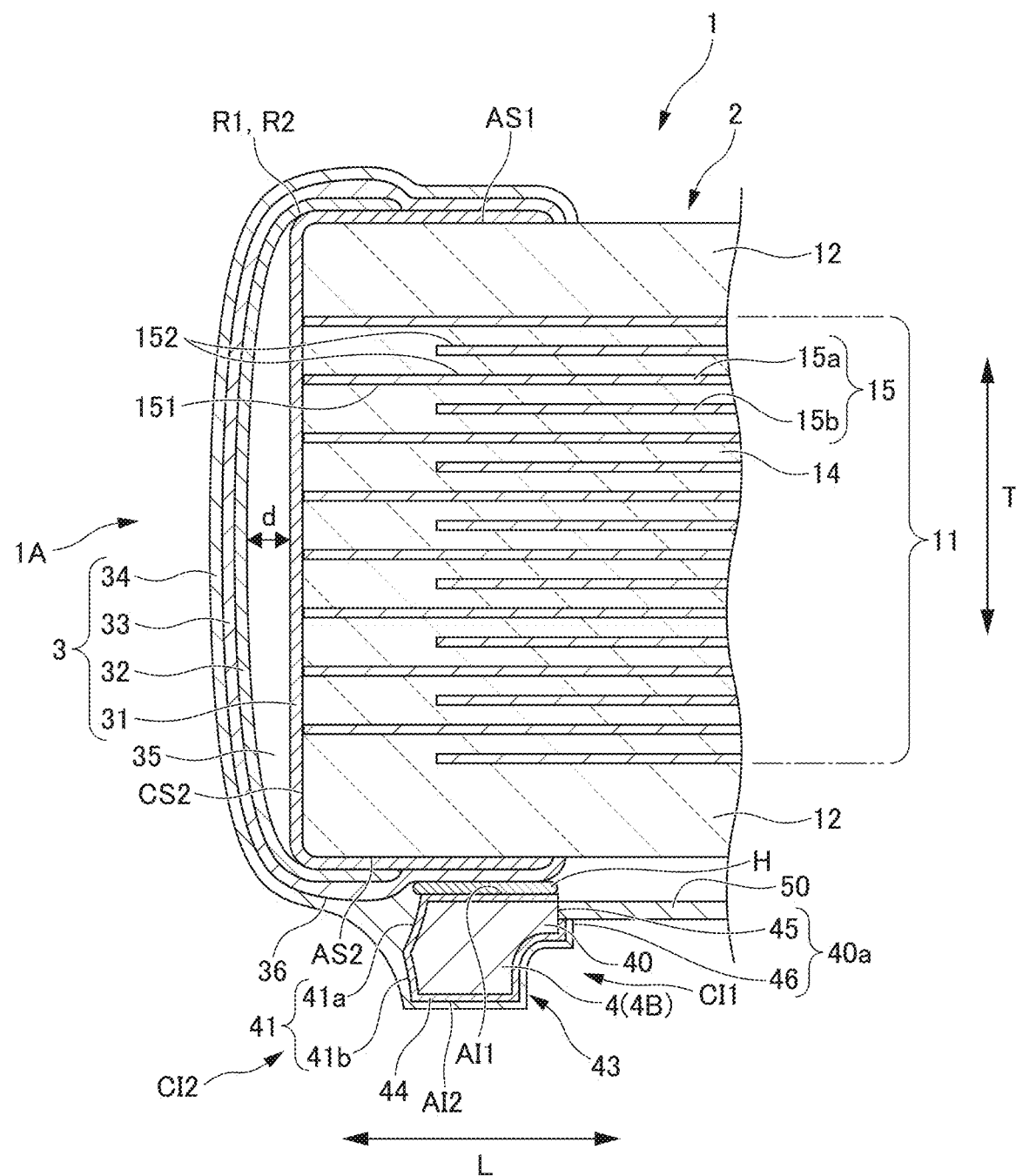
FIG. 2 is a partial cross-sectional view taken along the line II-II in FIG. 1 of the multilayer ceramic capacitor 1.
Figure 3:
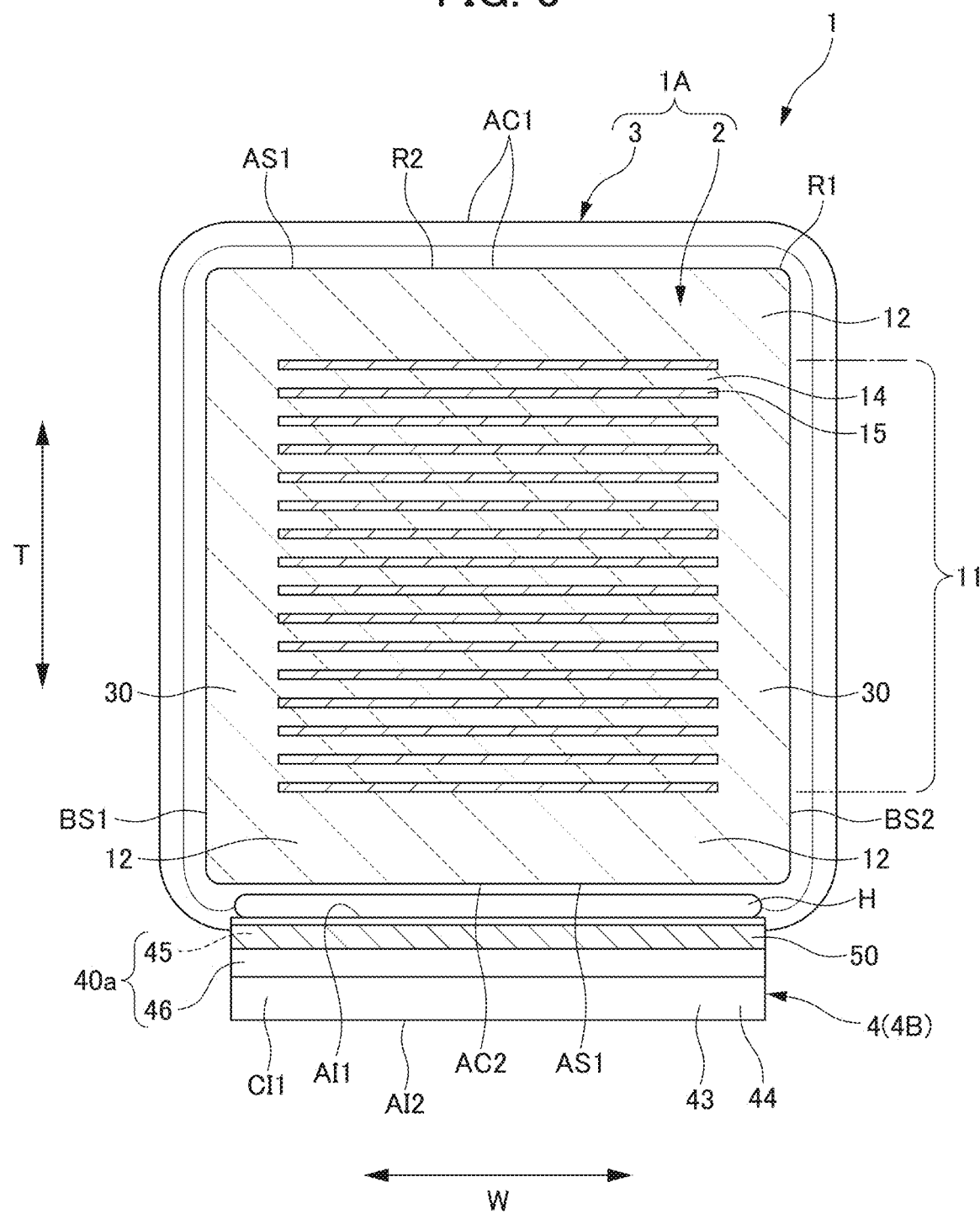
FIG. 3 is a cross-sectional view taken along the line III-III in FIG. 1 of the multilayer ceramic capacitor 1.

Preferred embodiments of the present invention will be described below with reference to the drawings. FIG. 1 is a schematic perspective view of a multilayer ceramic capacitor 1 according to a preferred embodiment of the present invention. FIG. 2 is a partial cross-sectional view taken along the line II-II in FIG. 1 of the multilayer ceramic capacitor 1. FIG. 3 is a cross-sectional view taken along the line III-III in FIG. 1 of the multilayer ceramic capacitor 1. The line II-II passes through the middle in the width direction W described later of the multilayer ceramic capacitor 1, and the line III-III passes through the middle in the length direction L described later.

The multilayer ceramic capacitor 1 has a rectangular or substantially rectangular parallelepiped shape, and includes a capacitor main body 1A including a multilayer body 2 and a pair of external electrodes 3 provided at both ends of the multilayer body 2, and an interposer 4 attached to the capacitor main body 1A. Furthermore, the multilayer body 2 includes an inner layer portion including a plurality of sets of dielectric layers 14 and internal electrode layers 15.

In the following description, as terms representing the orientation of the multilayer ceramic capacitor 1, the direction in which the pair of external electrodes 3 are provided is referred to as a length direction L. The direction in which the dielectric layers 14 and the internal electrode layers 15 are laminated (stacked) is referred to as a lamination direction T. The direction intersecting both the length direction L and the lamination direction T is referred to as a width direction W. In the present preferred embodiment, the width direction W is perpendicular or substantially perpendicular to both the length direction L and the lamination direction T.

Outer Surface of Multilayer Body 2

Among the six outer surfaces of the multilayer body 2, a pair of outer surfaces opposing each other in the lamination direction T are referred to as a multilayer body first main surface AS1 and a multilayer body second main surface AS2, respectively, a pair of outer surfaces opposing each other in the width direction W are referred to as a multilayer body first side surface BS1 and a multilayer body second side surface BS2, respectively, and a pair of outer surfaces opposing each other in the length direction L are referred to as a multilayer body first end surface CS1 and a multilayer body second end surface CS2.

When it is not necessary to particularly distinguish between the multilayer body first main surface AS1 and the multilayer body second main surface AS2, they are collectively referred to as a multilayer body main surface AS, when it is not necessary to particularly distinguish between the multilayer body first side surface BS1 and the multilayer body second side surface BS2, they are collectively referred to as a multilayer body main surface BS, and when it is not necessary to particularly distinguish between the multilayer body first end surface CS1 and the multilayer body second end surface CS2, they are collectively referred to as a multilayer body end surface CS.

Outer Surface of Capacitor Main Body 1A

Among the six outer surfaces of the capacitor main body 1A, a pair of outer surfaces opposing each other in the lamination direction T is referred to as a capacitor first main surface AC1 and a capacitor second main surface AC2, respectively, a pair of outer surfaces opposing each other in the width direction W is referred to as a capacitor first side surface BC1 and a capacitor second side surface BC2, respectively, and a pair of outer surfaces opposing each other in the length direction L is referred to as a capacitor first end surface CC1 and a capacitor second end surface CC2, respectively.

When it is not necessary to particularly distinguish between the capacitor first main surface AC1 and the capacitor second main surface AC2, they are collectively referred to as a capacitor main surface AC, when it is not necessary to particularly distinguish between the capacitor first side surface BC1 and the capacitor second side surface BC2, they are collectively referred to as a capacitor main surface BC, and when it is not necessary to particularly distinguish between the capacitor first end surface CC1 and the capacitor second end surface CC2, they are collectively referred to as a capacitor end surface CC.

Outer Surface of Interposer 4

Furthermore, the interposer 4 includes a first interposer 4A and a second interposer 4B. Among the six outer surfaces of the first interposer 4A and the second interposer 4B, an outer surface close to the capacitor main body 1A of a pair of outer surfaces opposed to each other in the lamination direction T are referred to as an interposer first main surface AI1, and an outer surface opposed thereto is referred to as an interposer second main surface AI2.

Of pairs of outer surfaces of the respective interposers 4 opposing each other in the length direction L, outer surfaces facing each other of the interposers 4 are referred to as interposer first end surfaces CI1, and outer surfaces opposed thereto are referred to as interposer second end surfaces CI2.

Of pairs of outer surfaces opposing each other in the width direction W in the respective interposers 4, as shown in FIG. described later, when viewed from the interposer first end surface CI1 with the interposer second main surface AI2 above, the surface on the right side is referred to as an interposer first side surface BI1, and the surface on the left side is referred to as an interposer second side surface BI2.

The interposer first main surfaces AI1 are close to the capacitor second main surface AC2, and the interposer first end surfaces CI1 of the first interposer 4A and the second interposer 4B are opposed to each other.

When it is not necessary to particularly distinguish the interposer first main surface AI1 and the interposer second main surface AI2 from each other, they are collectively referred to as an interposer main surface AI, when it is not necessary to particularly distinguish the interposer first side surface BI1 and the interposer second side surface BI2 from each other, they are collectively referred to as an interposer side surface BI, and when it is not necessary to particularly distinguish the interposer first end surface CI1 and the interposer second end surface CI2 from each other, they are collectively referred to as an interposer end surface CI.

Multilayer Body 2

The multilayer body 2 preferably includes rounded corner portions R1 and rounded ridge portions R2. The corner portions R1 are each a portion at which the multilayer body main surface AS, the multilayer body side surface BS, and the multilayer body end surface CS intersect. The ridge portions R2 are each a portion at which two surfaces of the multilayer body 2 intersect, i.e., the multilayer body main surface AS and the multilayer body side surface BS intersect, the multilayer body main surface AS and the multilayer body end surface CS intersect, or the multilayer body side surface BS and the multilayer body end surface CS intersect.

The multilayer body 2 includes the inner layer portion 11, outer layer portions 12 respectively provided close to the main surfaces of the inner layer portion 11, and side gap portions 30.

Inner Layer Portion 11

The inner layer portion 11 includes the plurality of sets of dielectric layers 14 and the internal electrode layers 15 which are alternately laminated along the lamination direction T.

Dielectric Layer 14

The dielectric layers 14 are each made of a ceramic material. As the ceramic material, for example, a dielectric ceramic including $BaTiO_3$ as a main component is used. Furthermore, as the ceramic material, a material may be used which is obtained by adding at least one sub components such as a Mn compound, an Fe compound, a Cr compound, a Co compound, a nickel compound, etc. to these main components.

Internal Electrode Layer 15

The internal electrode layers 15 are preferably made of, for example, a metallic material such as nickel, Cu, Ag, Pd, a Ag—Pd alloy, Au, or the like.

Furthermore, the internal electrode layers 15 each include a plurality of first internal electrode layer 15a and a plurality of second internal electrode layer 15b. The first internal electrode layer 15a and the second internal electrode layer 15b are alternately provided.

When it is not necessary to distinguish between the first internal electrode layers 15a and the second internal electrode layers 15b, they are collectively referred to as an internal electrode layer 15.

The internal electrode layers 15 each include an opposing portion 152 at which the first internal electrode layer 15a faces the second internal electrode layer 15b, and a lead-out portion 151 which extends from the opposing portion 152 toward one of the multilayer body end surfaces CS. An end of the lead-out portion 151 is exposed at the multilayer body end surface CS, and is electrically connected to the external electrode 3.

The direction in which the lead-out portion 151 extends differs between the first internal electrode layer 15a and the second internal electrode layer 15b, and alternately extends to the multilayer body first end surface CS1 and the multilayer body second end surface CS2.

Furthermore, charges are accumulated between the opposing portions 152 of the first internal electrode layer 15a and the second internal electrode layer 15b adjacent to each other in the lamination direction T, such that the characteristics of the capacitor are provided.

Outer Layer Portion 12

The outer layer portions 12 are each made of the same material as the dielectric layers 14 of the inner layer portion 11.

Side Gap Portion 30

The side gap portions 30 are provided on both sides of the region of the multilayer body where the internal electrode layers 15 are provided, and close to the multilayer body side surfaces BS. The side gap portions 30 are integrally manufactured with the same material as the dielectric layers 14.

External Electrode 3

The external electrodes 3 are provided on the multilayer body end surfaces CS on both sides of the multilayer body 2. The external electrodes 3 cover not only the multilayer body end surface CS, but also portions close to the multilayer body end surface CS, of the multilayer body main surface AS and the multilayer body side surface BS. As described above, the end portions of the lead-out portions 151 of the internal electrode layers 15 are each exposed to the multilayer body end surface CS, and electrically connected to the external electrode 3.

Structure of External Electrode 3

As shown in FIG. 2, the external electrodes 3 each include, for example, a copper electrode layer 31, a conductive resin layer 32 provided on the outside of the copper electrode layer 31, a nickel-plated layer 33 provided on the outside of the conductive resin layer 32, and a tin-plated layer 34 on the outside of the nickel-plated layer 33.

Copper Electrode Layer 31

The copper electrode layer 31 is provided, for example, by applying and firing a conductive paste including a conductive metal and glass. As shown in FIG. 2, the copper electrode layer 31 covers not only the multilayer body end surface CS on both sides of the multilayer body 2, but also extends to the multilayer body main surface AS, and covers a portion of the multilayer body main surface AS close to the multilayer body end surface CS.

Conductive Resin Layer 32

The conductive resin layer 32 is provided on the outside of the copper electrode layer 31 to cover the copper electrode layer 31. The conductive resin layer 32 may include any configuration including a thermosetting resin and a metal component, for example. As specific examples of the thermosetting resin, various known thermosetting resins such as epoxy resin, phenolic resin, urethane resin, silicone resin, polyimide resin, and the like can be used. As the metal component, for example, Ag can be used, or a metal powder coated with Ag on the surface of the base metal powder can be used.

Since the conductive resin layer 32 includes a thermosetting resin, it is more flexible than the copper electrode layer 31 made of, for example, a plating film or a fired product of a conductive paste. Therefore, even when an impact caused by physical shock or thermal cycling of the multilayer ceramic capacitor 1 is applied, the conductive resin layer 32 defines and functions as a buffer layer. Therefore, the conductive resin layer 32 reduces or prevents cracks in the multilayer ceramic capacitor 1 from occurring, easily absorbs piezoelectric vibration, and thus reduces or prevents "acoustic noise".

Gap 35

A gap 35 is provided between the copper electrode layer 31 and the conductive resin layer 32. In the gap 35, a distance d in the length direction L between the copper electrode layer 31 and the conductive resin layer 32 is longest in the middle portion in the width direction W and the lamination direction T at the multilayer body end surface CS on which the copper electrode layer is provided. Furthermore, the distance between the copper electrode layer 31 and the conductive resin layer 32 becomes shorter approaching the end portion of the multilayer body end surface CS, i.e., approaching the multilayer body main surface AS or the multilayer body side surface BS. Moreover, the gap 35 is eliminated or substantially eliminated at the corner portion R1 and the ridge portion R2, such that the copper electrode layer 31 and the conductive resin layer 32 are in contact with each other.

Thus, since the distance d in the length direction L of the gap 35 is longest in the middle portion in the width direction W and the lamination direction T at the multilayer body end surface CS, the external electrode 3 has a shape that bulges in the length direction L.

Similarly to the copper electrode layer 31, the conductive resin layer 32 extends not only to the multilayer body end surface CS on both sides of the multilayer body 2, but also to the multilayer body main surface AS, and also covers a portion of the multilayer body main surface AS close to the multilayer body end surface CS.

However, the conductive resin layer 32 terminates at a location closer to the multilayer body end surface CS on the multilayer body main surface AS in the length direction L than the copper electrode layer 31 is. That is, the length of the conductive resin layer 32 extending to the multilayer body main surface AS is equal to or less than the length of the copper electrode layer 31 extending to the multilayer body main surface AS.

Nickel-plated Layer 33

The nickel-plated layer 33 is provided on the outside of the conductive resin layer 32 to cover the conductive resin layer 32. The nickel-plated layer 33 is made of plating of nickel or an alloy including nickel, for example.

Similarly to the copper electrode layer 31, the nickel-plated layer 33 extends not only to the multilayer body end surface CS on both sides of the multilayer body 2, but also to the multilayer body main surface AS, and also covers a portion of the multilayer body main surface AS close to the multilayer body end surface CS. The nickel-plated layer 33 extends beyond the conductive resin layer 32 and to the same or substantially the same position as the copper electrode layer 31 on the multilayer body main surface AS.

Bulge Portion 36

Here, similarly to the copper electrode layer 31, the conductive resin layer 32 extends not only to the multilayer body end surface CS on both sides of the multilayer body 2, but also to the multilayer body main surface AS, and covers a portion of the multilayer body main surface AS close to the multilayer body end surface CS. However, the conductive resin layer 32 does not extend to the multilayer body main surface AS much as the copper electrode layer 31 extends to the multilayer body main surface AS.

Therefore, the external electrodes 3 each include a bulge portion 36 provided therein. The bulge portion 36 is provided such that a portion at which the conductive resin layer is provided bulges in the lamination direction T on the multilayer body main surface AS when viewed from the outside of the nickel-plated layer 33.

Tin-Plated Layer 34

A tin-plated layer 34 is provided on the outside of the nickel-plated layer 33. The tin-plated layer 34 is made of plating of an alloy including tin or tin, for example. As described later, in a state in which the interposer 4 is attached to the nickel-plated layer 33, the tin-plated layer 34 covers the outside including a protrusion 40 to be described later of the interposer 4, except for a non-plated region 45 thereof.

It should be noted that the plated layer of tin or an alloy including tin in the present preferred embodiment includes a single layer of the tin-plated layer 34. However, the present invention is not limited thereto, and may include a structure including two tin-plated layers including another tin-plated layer which covers the nickel-plated layer 33 without covering the interposer 4 between the nickel-plated layer 33 and the tin-plated layer 34.

Size of Capacitor Main Body 1A

The capacitor main body 1A in the present preferred embodiment has the three sizes of type A, type B, and type C. FIG. 4 is a table showing favorable ranges for each of the types of the capacitor main body 1A.

Type A

The ranges for a Type-A of the capacitor main body 1A are as follows, as shown in the table.

Dimension in length direction L: about 0.95 mm to about 1.15 mm

Dimension in width direction W: about 0.62 mm to about 0.68 mm

Dimension in lamination direction T: about 0.62 mm to about 0.68 mm

Dimension in the lamination direction T of the dielectric layer 14: about 0.98 mm to about 1.09 μm Dimension in the lamination direction T of the internal electrode layer 15: about 0.62 mm to about 0.68 μm Number of layers of each of the dielectric layers 14 and the internal electrode layers 15: 350 to 380

Dimension in the lamination direction T of the outer layer portion 12: about 17 μm to about 23 μm Deviation amount in the length direction L of the internal electrode layers 15: about 45 μm to about 48 μm Dimension in the width direction W of the side gap portion 30: about 32 μm to about 42 μm The deviation amount in the length direction L of the internal electrode layers 15 corresponds to the lengths of the respective lead-out portions 151 of the first internal electrode layer 15a and the second internal electrode layer 15b which are alternately provided.

Type B

The ranges for a type-B of the capacitor main body 1A are as follows, as shown in the table.

Dimension in length direction L: about 1.62 mm to about 1.72 mm

Dimension in width direction W: about 0.88 mm to about 0.96 mm

Dimension in lamination direction T: about 0.89 mm to about 0.97 mm

Dimension in the lamination direction T of the dielectric layer 14: about 1.35 μm to about 1.45 μm Dimension in the lamination direction T of the internal electrode layer 15: about 0.67 μm to about 0.77 μm Number of layers of each of the dielectric layers 14 and the internal electrode layers 15: 386 to 426

Dimension in the lamination direction T of the outer layer portion 12: about 35 μm to about 45 μm Deviation amount in the length direction L of the internal electrode layer 15: about 72 μm to about 78 μm Dimension in the width direction W of the side gap portion 30: about 52 μm to about 62 μm Type C The ranges for the type C of the capacitor main body 1A are as follows, as shown in the table.

Dimension in the length direction L: about 1.81 mm to about 2.01 mm

Dimension in width direction W: about 1.29 mm to about 1.49 mm

Dimension in lamination direction T: about 1.32 mm to about 1.42 mm

Dimension in the lamination direction T of the dielectric layer 14: about 1.88 μm to about 1.96 μm Dimension in the lamination direction T of the internal electrode layer 15: about 0.73 μm to about 0.86 μm Number of layers of each of the dielectric layer 14 and the internal electrode layer 15: 440 to 490

Dimension in the lamination direction T of the outer layer portion 12: about 52 μm to about 63 μm Deviation amount in the length direction L of the internal electrode layer 15: about 72 μm to about 85 μm Dimension in the width direction W of the side gap portion 30: about 63 μm to about 75 μm Interposer 4

Figure 5:
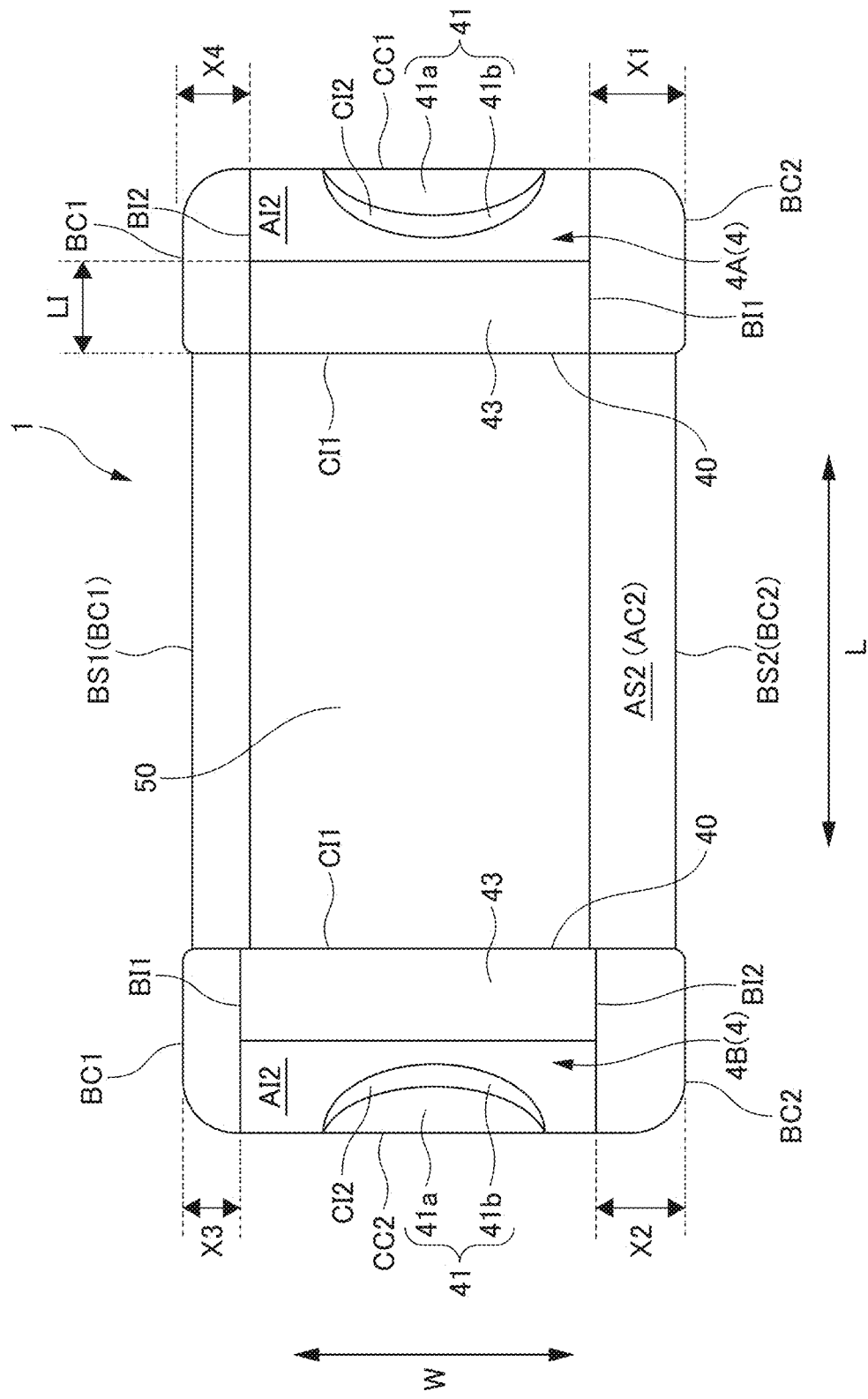
FIG. 5 is a view of the multilayer ceramic capacitor 1 viewed from the side on which an interposer 4 is provided.
Figure 6:
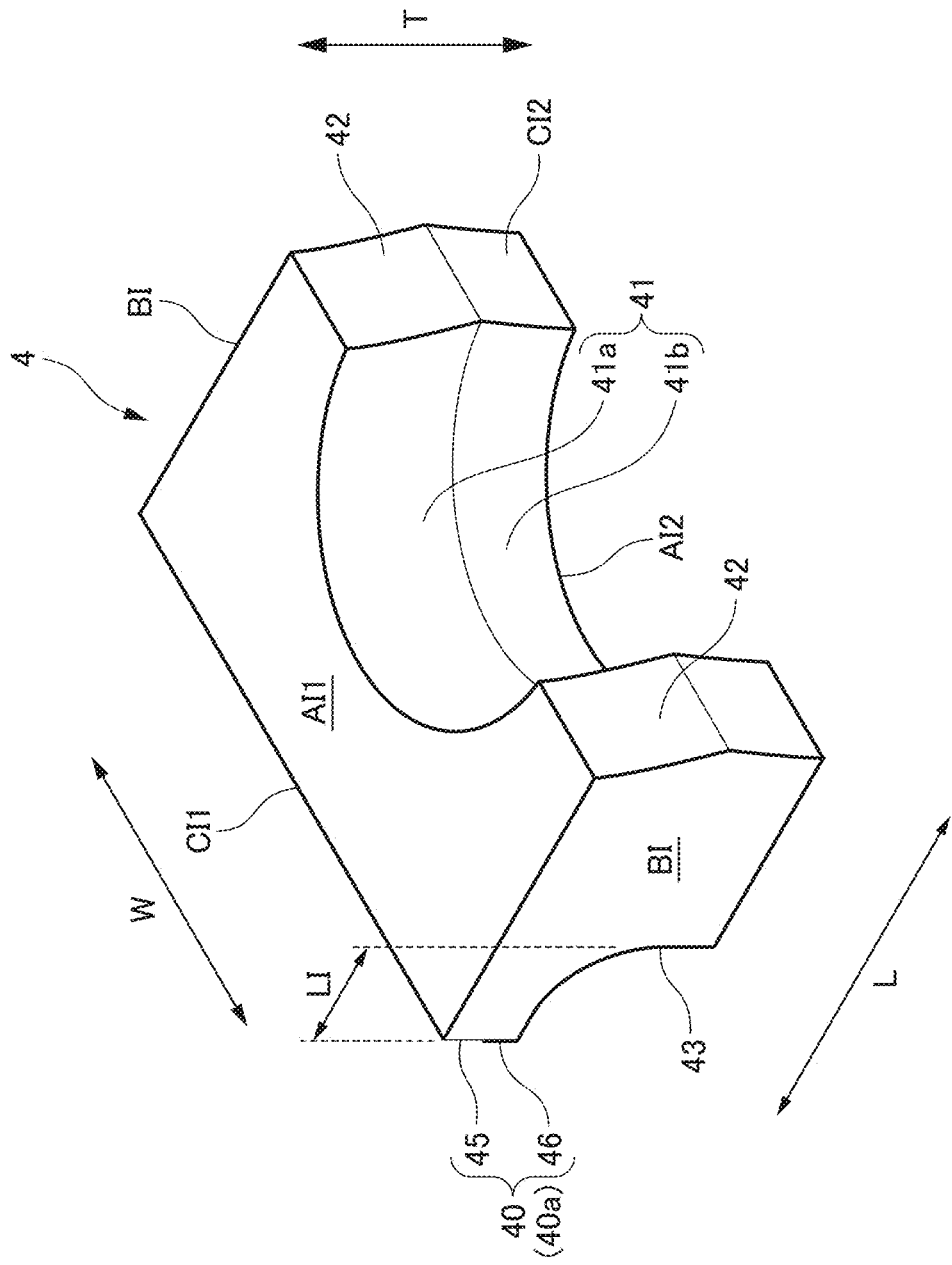
FIG. 6 is a perspective view of the interposer 4.

FIG. 5 is a view of the multilayer ceramic capacitor 1 viewed from the side on which an interposer 4 is provided. FIG. 6 is a perspective view of the interposer 4. The interposer 4 includes a pair of the first interposer 4A and the second interposer 4B. Hereinafter, when it is not necessary to distinguish between the first interposer 4A and the second interposer 4B, they are referred to as an interposer.

On the capacitor second main surface AC2 of the capacitor main body 1A, the first interposer 4A is provided adjacent to the capacitor first end surface CC1 in the length direction L, and the second interposer 4B is provided adjacent to the other capacitor second end surface CC2 in the length direction L. The first interposer 4A and the second interposer 4B have the same or substantially the same shape, are opposed to each other, and are spaced apart from each other by a predetermined distance.

The first interposer 4A is spaced apart from the second interposer 4B. However, they are connected by an insulation member 50, such as a resin member, for example.

Shape of Interposer 4

The interposer 4 is made of a material including copper or a copper alloy, for example, and has a shape in which a plurality of recess portions are provided in a rectangular or substantially rectangular parallelepiped block portion.

A third recess portion 43 is provided on the interposer first end surface CI1 of the interposer 4, such that the protrusion 40 is provided. Therefore, the interposer first end surface CI1 includes a flat tip surface 40a of a tip of the protrusion 40, and a curved surface of the third recess portion 43.

A first recess portion 41 and second recess portions 42 are provided on the interposer second end surface CI2 of the interposer 4. The interposer second end surface CI2 includes the two curved surfaces of the first recess portion 41 and the second recess portions 42.

Third Recess Portion 43

The third recess portion 43 has a shape in which the ridge portion between the interposer first end surface CI1 and the interposer second main surface AI2 is cut by a curved surface.

Protrusion 40

By providing the third recess portion 43, the protrusion 40 protruding in the length direction L is provided over the entire or substantially the entire length in the width direction W on the interposer first end surface CI1 close to the capacitor second main surface AC2. The protrusion 40 extends from one interposer 4 toward the other interposer 4.

The length LI shown in FIGS. 5 and 6 in which the protrusion 40 extends in the length direction L from the interposer second main surface AI2 is about 50 μm or more and about 100 μm or less.

Advantageous Effects of Protrusion 40

There is a gap between the multilayer ceramic capacitor 1 including the interposer 4 and the board due to the interposer 4. Therefore, when the board is distorted, the multilayer ceramic capacitor 1 may be bent at the portion not in contact with the interposer 4.

However, in the multilayer ceramic capacitor 1 of the present preferred embodiment, the protrusion 40 is provided in the interposer 4, and the upper side of the protrusion 40 is a flat surface that continues flush from the interposer first main surface AI1.

Therefore, the contact area between the capacitor second main surface AC2 of the capacitor main body 1A, and the interposer first main surface AI1 of the interposer 4 is increased by the protrusion 40. Therefore, in the multilayer ceramic capacitor 1, the bending strength is improved, and the possibility of being bent is reduced.

First Recess Portion 41

As shown in FIGS. 5 and 6, the interposer 4 includes the first recess portion 41 on the interposer second end surface CI2 in a certain area around the middle portion in the width direction W.

The first recess portion 41 further includes an upper first recess portion 41a adjacent to the interposer first main surface AI1, and a lower first recess portion 41b adjacent to the interposer second main surface AI2. The upper first recess portion 41a and the lower first recess portion 41b are continuous in the lamination direction T.

When viewed in FIG. 5, the inner surfaces of the upper first recess portion 41a and the lower first recess portion 41b each have, for example, an elliptical or substantially elliptical arc shape or an arcuate or substantially arcuate shape, and when viewed from the cross section in FIG. 2, each include an elliptical or substantially elliptical arc shape or an arcuate or substantially arcuate shape, i.e., include a first curved surface. Thus, since the inner surfaces of the upper first recess portion 41a and the lower first recess portion 41b each include a curved surface, it is possible to reduce or prevent solder from rising more efficiently.

Advantageous Effects of First Recess Portion 41

Such a configuration of the first recess portion 41 provides the following advantageous effects.

A solder is used when mounting the multilayer ceramic capacitor 1 including the interposer 4 on a mounting board.

At this time, if a surplus solder is present, there is a possibility that the solder protrudes on the outside of the interposer 4. However, when the first recess portion 41 is provided as in the present preferred embodiment, since the surplus solder is accommodated in the first recess portion 41, the possibility of the solder protruding on the outside of the interposer 4 is reduced.

Furthermore, since the first recess portion 41 includes a two-stage structure, first, the surplus solder fills the lower first recess portion 41b, and if surplus solder is still present, the surplus solder goes beyond the boundary between the lower first recess portion 41b and the upper first recess portion 41a, and reaches the first recess portion 41a.

In other words, the solder connecting the mounting board and the interposer 4 hardly rises up to the upper side. Therefore, since the mounting board and the capacitor main body 1A are connected by the solder, the possibility of generating acoustic noise is reduced.

Furthermore, as shown in FIG. 2 and as described above, when the capacitor main surface AC is viewed from the outside of the nickel-plated layer 33, the external electrodes 3 each include the bulge portion 36 in which a portion at which the conductive resin layer 32 is provided bulges in the lamination direction T.

The bulge portion 36 has a dimension to fit in the first recess portion 41 in a cross section passing through the middle in the width direction W of the multilayer ceramic capacitor 1 shown in FIG. 2.

Advantageous Effects Derived from Bulge Portion 36 Being Fit in First Recess Portion 41

For example, if the bulge portion 36 is not provided when a force is applied to a mounting board and a distortion is caused, the ridge portion between the interposer first end surface CI1 and the interposer first main surface AI1 in the interposer 4 presses the capacitor second main surface AC2, such that the stress is concentrated on the pressed portion in the capacitor main body 1A.

However, when the bulge portion 36 is provided, in the capacitor main body 1A, the stress is easily applied to the side end portion of the bulge portion 36 close to the interposer second end surface CI2. Therefore, portions at which the stress is concentrated in the capacitor main body 1A are dispersed, such that the bending strength of the capacitor main body 1A is improved.

Second Recess Portion 42

As shown in FIG. 6, the interposer 4 includes the second recess portions 42 on both sides of the first recess portion 41 in the width direction W on the interposer second end surface CI2. The second recess portions 42 are each about ±10% of a half of the thickness of the interposer 4 in the lamination direction T. When viewed from the interposer side surface BI, the inner surfaces of the second recess portions 42 each have an elliptical or substantially elliptical arc shape or an arcuate or substantially arcuate shape, i.e., a second curved surface. Thus, since the inner surfaces of the second recess portions 42 each have a curved surface, it is possible to reduce or prevent the solder from rising more efficiently.

Advantageous Effects of Second Recess Portion 42

Such a configuration of the second recess portions 42 causes the solder connecting the mounting board and the interposer 4 to hardly rise up immediately to the upper side. Therefore, since the mounting board and the capacitor main body 1A are connected by the solder, the possibility of generating acoustic noise is reduced.

Nickel-plated Layer 44 of Interposer 4

As shown in FIG. 2, the nickel-plated layer 44 is provided on the outer periphery of the interposer 4. The nickel-plated layer 44 does not cover a portion at which the insulation member 50 connecting the first interposer 4A and the second interposer 4B is present, i.e., a portion of the upper side of the tip face 40a of the protrusion 40 adjacent to the interposer first main surface AI1 and adjacent to the capacitor main body 1A. This portion corresponds to the non-plated region 45. The tip surface 40a of the protrusion 40 includes the non-plated region 45 on the upper side, and a plated region 46 on the lower side.

Joining between Interposer 4 and Capacitor Main Body 1A

Furthermore, the interposer first main surface AI1, which is an upper surface of the interposer 4 and to which the nickel-plated layer 44 is applied, is joined with the capacitor second main surface AC2, which is a lower surface of the capacitor main body 1A, by the nickel-plated layer 33 of the external electrode 3 and a solder H.

Tin Plating of Interposer 4 and External Electrode 3

The tin-plated layer 34 is further provided on the outer periphery of the external electrode 3 of the capacitor main body 1A and the interposer 4. The tin-plated layer 34 does not cover a portion at which the insulation member 50 connecting the first interposer 4A and the second interposer 4B is present, i.e., the non-plated region 45 at which the nickel-plated layer 44 of the protrusion 40 is not provided.

In other words, similarly to the nickel-plated layer 44, the tin-plated layer 34 does not cover a portion of the upper side of the tip surface 40a of the protrusion 40 close to the interposer first main surface AI1, i.e., the non-plated region 45 close to the capacitor main body 1A.

Advantageous Effects Derived from Tin-plated layer 34 not Being Provided in Non-plated Region 45

In the portion at which the insulation member 50 connecting the first interposer 4A and the second interposer 4B is not present, it is not possible for the solder to rise. Therefore, the possibility of generating acoustic noise due to the solder connecting the mounting board and the capacitor main body 1A is reduced.

Plating on Surface of Recess Portion

The surface of each of the recess portions of the interposer 4 is covered with the nickel-plated layer 44 and the tin-plated layer 34.

Placement Position of Interposer

As described above, the interposer first main surface AI1, which is an upper surface of the interposer 4, is joined with the capacitor second main surface AC2, which is a lower surface of the capacitor main body 1A, by the external electrode 3 and the solder H.

As shown in FIG. 5, the dimension in the width direction W of the interposer is smaller than the dimension in the width direction W of the capacitor main body 1A. Here, when assuming that, the distance in the width direction W between the interposer first side surface BI1 and the capacitor first side surface BC1 of the first interposer 4A is defined as X1 as shown in the lower right side in the drawings, the distance in the width direction W between the interposer second side surface BI2 and the capacitor first side surface BC1 of the second interposer 4B is defined as X2 as shown in the lower left side in the drawings; the distance in the width direction W between the interposer first side surface BI1 and the capacitor second side surface BC2 of the second interposer 4B is defined as X3 as shown in the upper left side in the drawings, and the distance in the width direction W between the interposer second side surface BI2 and the capacitor second side surface BC2 of the first interposer 4A is defined as X4 as shown in the upper right side in FIGS. 5, X2>X3 and X1>X4 are satisfied.

Furthermore, X1/X4*0.9<X2/X3<X1/X4*1.1 is satisfied.

In other words, in the multilayer ceramic capacitor 1, as viewed from the lower surface, i.e., in a plan view as viewed from the capacitor second main surface AC2, the interposer 4 with respect to the capacitor main body 1A satisfies the relationships of X2>X3 and X1>X4. Therefore, the interposer 4 is positioned to be biased in the width direction W with respect to the capacitor main body 1A.

However, the slope of the center line passing through the center in the width direction W of each of the first interposer 4A and the second interposer 4B and extending in the length direction L with respect to the center line passing through the middle in the width direction W of the capacitor main body 1A and extending in the length direction L is X1/X4*0.9<X2/X3<X1/X4*1.1. Therefore, the slope angle is small, and thus, both the center lines are substantially parallel to each other.

However, the present invention is not limited thereto, and may satisfy X2=X3 and X1=X4.

Alternatively, the present invention may satisfy X2=X3=X1=X4.

It should be noted that any one of X1, X2, X3, and X4 is, for example, about 20 μm or less.

Advantageous Effects Derived from X2>X3 and X1>X4

Thus, since the multilayer ceramic capacitor 1 of the present preferred embodiment satisfies X2>X3 and X1>X4, it is possible to provide the multilayer ceramic capacitor 1 in which the mounting orientation of the multilayer ceramic capacitor 1 to the board is identifiable when mounted on the board. Therefore, when a specific mounting orientation relative to the board is required to be identified, it is possible to easily identify the orientation.

Method of Manufacturing Multilayer Ceramic Capacitor 1

Figure 7:
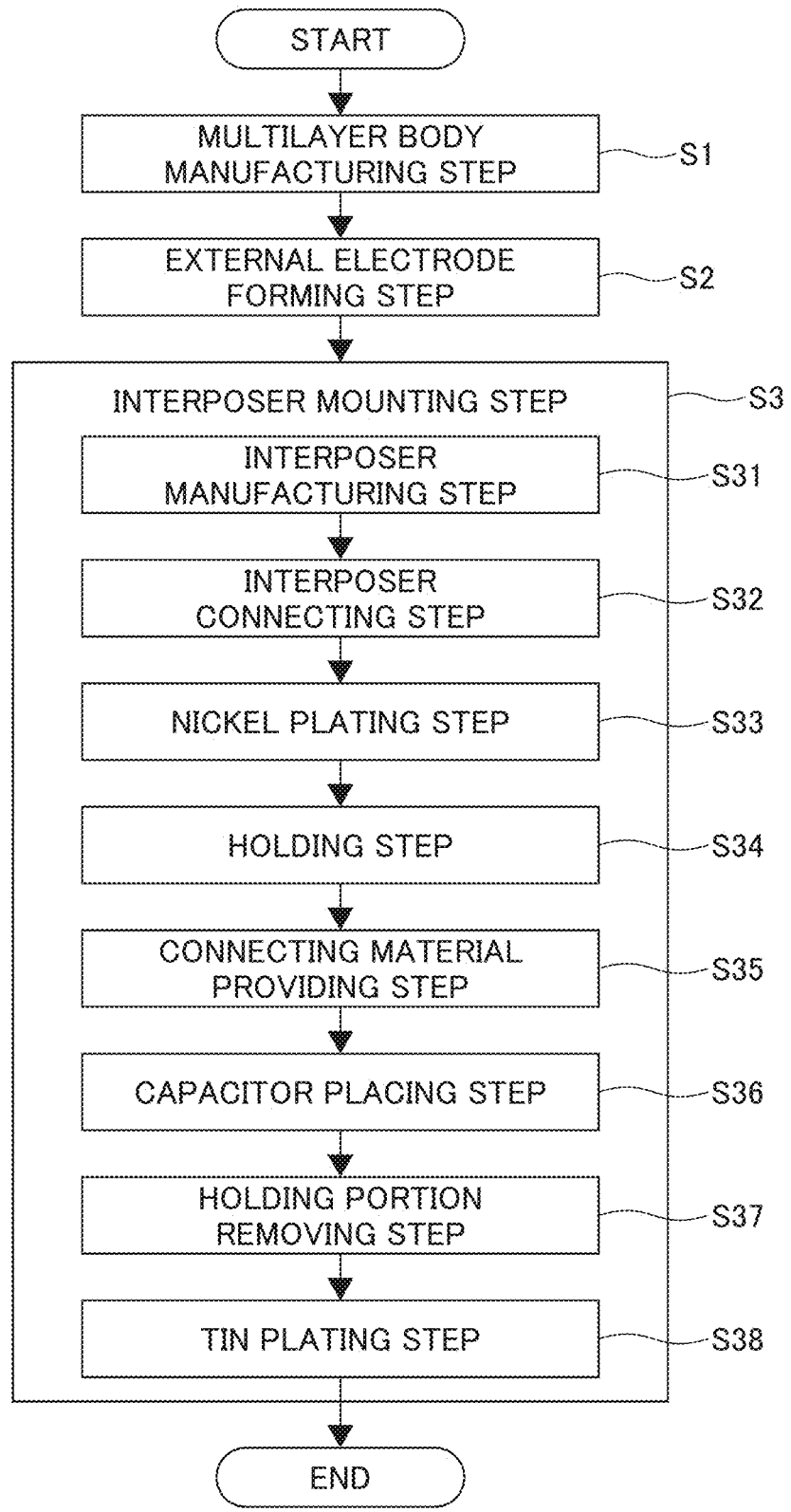
FIG. 7 is a flowchart explaining a method of manufacturing the multilayer ceramic capacitor 1 according to a preferred embodiment of the present invention.

Next, a non-limiting example of a method of manufacturing the multilayer ceramic capacitor 1 according to the present preferred embodiment will be described. FIG. 7 is a flowchart explaining a method of manufacturing the multilayer ceramic capacitor 1.

The manufacturing process of the multilayer ceramic capacitor 1 includes a multilayer body manufacturing step S1, an external electrode forming step S2, and an interposer mounting step S3.

Multilayer Body Manufacturing Step S1

First, a material sheet is provided in which a pattern of the internal electrode layers 15 is printed with a conductive paste onto a lamination ceramic green sheet molded in a sheet shape with a ceramic slurry.

Then, a plurality of material sheets are stacked such that the internal electrode patterns become shifted (offset) by about a half pitch in the length direction between adjacent material sheets.

Furthermore, ceramic green sheets for the outer layer portion defining and functioning as the outer layer portions are stacked on both sides of the stacked material sheets, such that a mother block member is formed by, for example, thermocompression bonding.

The mother block member is divided along the cutting line corresponding to the dimension of the multilayer body, such that a plurality of multilayer bodies 2 are manufactured.

External Electrode Forming Step S2

Next, the copper electrode layer 31, the conductive resin layer 32, and the nickel-plated layer 33 are sequentially formed at both end portions of the multilayer body 2, such that the external electrodes 3 are formed.

Copper Electrode Layer 31

The copper electrode layer 31 is formed, for example, by applying and firing a conductive paste containing a conductive metal and glass. As shown in FIG. 2, the copper electrode layer 31 extends not only to the multilayer body end surface CS on both sides of the multilayer body 2, but also to the multilayer body main surface AS, and covers a portion of the multilayer body main surface AS close to the multilayer body end surface CS.

Conductive Resin Layer 32

The conductive resin layer 32 is formed on the outside of the copper electrode layer 31 to cover the copper electrode layer 31. At this time, the length of the conductive resin layer 32 extending to the multilayer body main surface AS is, for example, equal to or less than the length of the copper electrode layer 31 extending to the multilayer body main surface AS.

Thus, since the conductive resin layer 32 does not extend to the multilayer body main surface AS as much as the copper electrode layer 31 extends to the multilayer body main surface AS, when viewed from the outside of the nickel-plated layer 33, the external electrode 3 includes the bulge portion 36 provided therein. The bulge portion 36 is provided such that a portion at which the conductive resin layer 32 is provided bulges in the lamination direction T on the multilayer body main surface AS.

Gap 35

Furthermore, the gap 35 is provided between the copper electrode layer 31 and the conductive resin layer 32. The gap 35 is provided such that the distance d in the length direction L becomes longest in the middle portion in the width direction W and the lamination direction T at the multilayer body end surface CS, such that the external electrode 3 bulges in the length direction L.

Nickel-plated Layer 33

The nickel-plated layer 33 is formed on the outside of the conductive resin layer 32 to cover the conductive resin layer 32.

The length of the nickel-plated layer 33 extending to the multilayer body main surface AS exceeds the length of the conductive resin layer 32, and is the same or substantially the same as the length of the copper electrode layer 31 extending to the multilayer body main surface AS.

Then, heating is performed at a set firing temperature in a nitrogen atmosphere. Thus, the external electrodes 3 are fired to the multilayer body 2, such that the capacitor main body 1A is manufactured.

Interposer Mounting Step S3

FIGS. 8A to 8H provide diagrams illustrating an interposer mounting step S3. In FIGS. 8A to 8H, the views shown on the upper side are top views, and the views shown on the lower side are side views. The interposer mounting step S3 includes an interposer manufacturing step S31, an interposer connecting step S32, a nickel plating step S33, a holding step S34, a connecting material providing step S35, a capacitor placing step S36, a holding portion removing step S37, and a tin plating step S38 to be described below.

Interposer Manufacturing Process S31

As shown in FIG. 8A and described above, a pair of the first interposer 4A and the second interposer 4B are manufactured, for example, by cutting rectangular or substantially rectangular parallelepiped blocking members made of copper, and forming the protrusions 40, the first recess portions 41, and the second recess portions 42 and the third recess portions 43.

Interposer Connecting Step S32

As shown in FIG. 8B, a pair of the first interposer 4A and the second interposer 4B are connected via the insulation member 50. The insulation member 50 is, for example, a plate-shaped glass epoxy. However, the present invention is not limited thereto, and the insulation member 50 may be manufactured by other insulation members.

The insulation member 50 is attached to the portion of the upper side of the tip of the protrusion 40 on the interposer first end surface CI1 of each of the pair of the first interposer 4A and the second interposer 4B. The portion of the upper side of the tip of the protrusion 40 is adjacent to the interposer first main surface AI1.

The length of the insulation member 50 corresponds to the distance between the two external electrodes 3 provided on both sides of the multilayer body 2. As shown in FIG. 1, the distance between the two external electrodes 3 is a distance L2 between the end portion of one of the external electrodes 3 extending to the multilayer body side surface BS and the end portion of the other of the external electrodes 3 extending to the multilayer body side surface BS.

Nickel Plating Step S33

As shown in FIG. 8C, the first interposer 4A and the second interposer 4B are subjected to a nickel plating process to form the nickel-plated layer 44. At this time, the nickel-plated layer 44 is not formed on the insulation member 50.

Holding Step S34

As shown in FIG. 8D, the first interposer 4A and the second interposer 4B on which the nickel-plated layer 44 is formed, and the insulation member 50 connecting them are provided on a holding portion 51, and fixed. The holding portion 51 includes a flat surface such as, for example, a sheet member or a plate-shaped plate member.

When joining the first interposer 4A and the second interposer 4B to the capacitor main body 1A subsequently, the holding portion 51 defines and functions as a pedestal to hold the first interposer 4A and the second interposer 4B in place at a predetermined position.

Although not included in the present preferred embodiment, an insulation member removing step may be provided between the holding step S34 and the subsequent connecting member providing step S35. In the insulation member removing step, the insulation member 50 is removed by separating the insulation member 50 from the first interposer 4A and the second interposer 4B. Then, the portion at which the insulation member 50 is cut, at the tip of the protrusion 40 of the interposer 4, becomes the non-plated region 45 of nickel plating.

Connecting Material Providing Step S35

As shown in FIG. 8E, for example, a cream solder H as an example of a connecting material for the connection between the interposer 4 and the external electrode is provided on the interposer 4 by, for example, screen printing or the like.

Capacitor Placing Step S36

As shown in FIG. 8F, the capacitor main body 1A is placed on the first interposer 4A and the second interposer 4B which are fixed on the holding portion 51.

Advantageous Effects Derived from Being Held by Insulation Member 50

Here, the distance between the first interposer 4A and the second interposer 4B on the holding portion 51 is the length of the insulation member 50 connecting them.

Therefore, when the capacitor main body 1A is placed on the first interposer 4A and the second interposer 4B, the first interposer 4A is placed below one of the external electrodes 3, and the second interposer 4B is placed below the other external electrode 3.

Therefore, it is possible to easily perform the positioning of the first interposer 4A and the second interposer 4B with respect to the external electrodes 3.

Holding Portion Removing Step S37

As shown in FIG. 8G, the holding portion 51 is removed from the article molded by the interposer 4 and the external electrodes 3 of the capacitor main body 1A being connected by the solder H.

Tin Plating Step S38

As shown in FIG. 8H, the tin-plated layer 34 is formed on the article in which the capacitor main body 1A is connected on the interposer 4 and the holding portion 51 is removed.

Here, since the insulation member 50 is present at the portion on the upper side of the tip of the protrusion 40 on the interposer first end surface CI1 adjacent to the interposer first main surface AI1, such a portion corresponds to the non-plated region 45 which is not covered with the nickel-plated layer 44, and the tin-plated layer 34 is not formed.

Thus, the multilayer ceramic capacitor 1 shown in FIG. 1 is manufactured, followed by being mounted on the mounting board.

Figure 9:
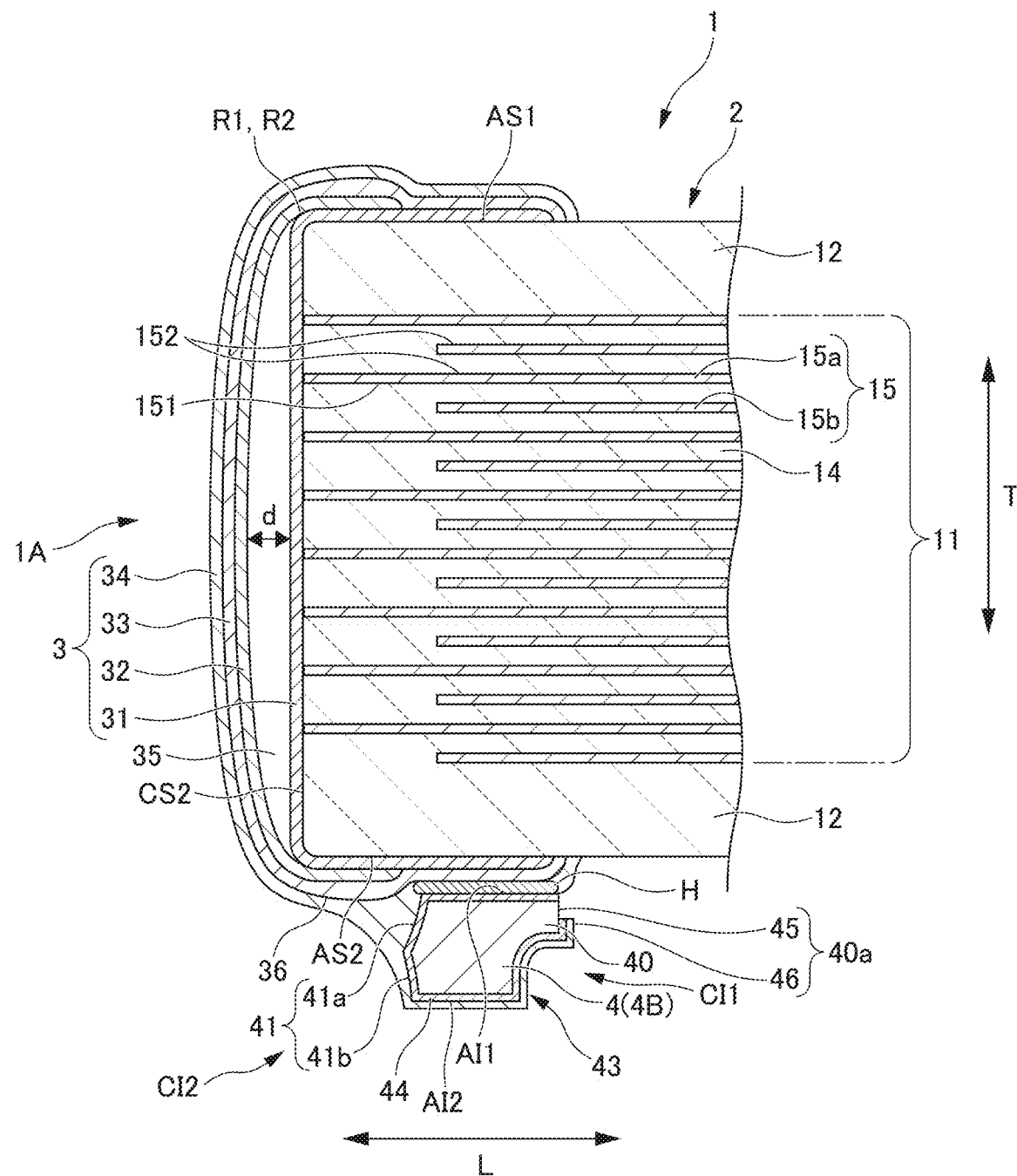
FIG. 9 is a partial cross-sectional view of the multilayer ceramic capacitor 1 according to a preferred embodiment of the present invention when an insulation member 50 is removed by an insulation member removing step.

FIG. 9 is a partial cross-sectional view of the multilayer ceramic capacitor 1 corresponding to FIG. 2 in a case in which the insulation member removing step is provided between the holding step S34 and the connecting material providing step S35, such that the insulation member 50 is removed. Even if the insulation member 50 is removed, since the removed portion does not include the nickel-plated layer 44 provided thereon, the tin-plated layer 34 is not formed in the tin plating step S38. Therefore, the non-plated region 45 is present at the portion on the upper side of the tip face 40a of the protrusion 40 adjacent to the interposer first main surface AI1, i.e., adjacent to the capacitor main body 1A.

During the mounting, since the two interposers 4 are connected by the insulation member 50, the solder does not rise up to the capacitor main body 1A beyond the insulation member 50. Therefore, the capacitor main body 1A is in no way connected to the board by the solder, such that the possibility of generating "acoustic noise" is reduced or prevented.

Furthermore, since neither of the nickel-plated layer 44 and the tin-plated layer 34 is formed in the non-plated region 45 in which the insulation member 50 is present, it is possible to reduce ESR (transmission series resistance) as the multilayer ceramic capacitor 1.

Furthermore, in the multilayer ceramic capacitor 1 according to the present preferred embodiment, as viewed from the lower surface, i.e., in a plan view as viewed from the capacitor second main surface AC2, the interposer 4 with respect to the capacitor main body 1A satisfies the relationships of X2>X3 and X1>X4.

Therefore, the interposer 4 is biased in the width direction W with respect to the capacitor main body 1A.

Therefore, when viewed from the lower surface, it is possible to identify the direction in the width direction W of the multilayer ceramic capacitor 1. Therefore, it is possible to choose the direction in the width direction W at the time of mounting on the board.

MODIFIED EXAMPLE

While preferred embodiments of the present invention have been described above, the present invention is not limited thereto.

In the above-described preferred embodiments, the interposer 4 is mounted parallel or substantially parallel to the capacitor main body 1A. That is, the respective interposer main surfaces AI of the first interposer 4A and the second interposer 4B are parallel or substantially parallel to each other, and located on the same or substantially the same horizontal plane. Then, the respective interposer main surfaces AI of the first interposer 4A and the second interposer 4B are parallel or substantially parallel to the capacitor main surface AC and the multilayer body main surface AS.

However, the present invention is not limited to this, and the respective interposer main surfaces AI of the first interposer 4A and the second interposer 4B may not be parallel or substantially parallel to each other. Furthermore, the respective interposer main surfaces AI of the first interposer 4A and the second interposer 4B may not be parallel or substantially parallel to the capacitor main surface AC or the multilayer body main surface AS.

Figure 10:
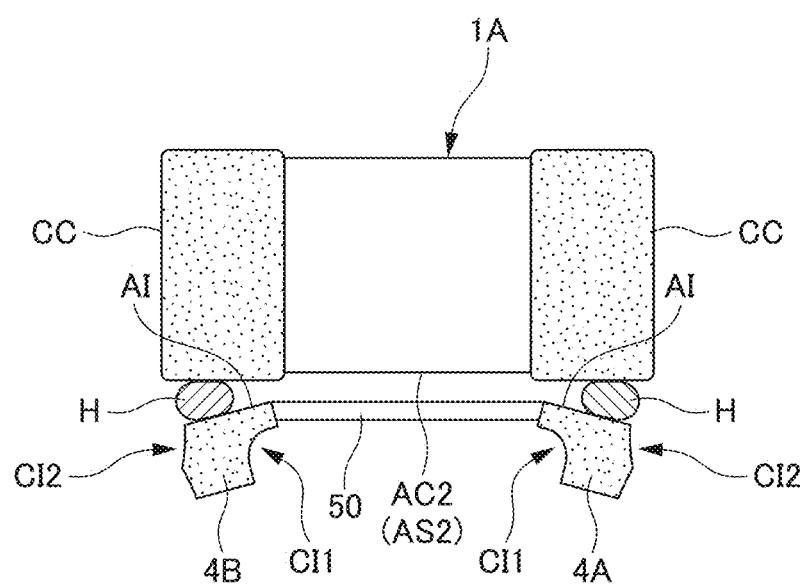
FIG. 10 is a diagram illustrating a multilayer ceramic capacitor 1 of a first modified example of a preferred embodiment of the present invention.
Figure 11:
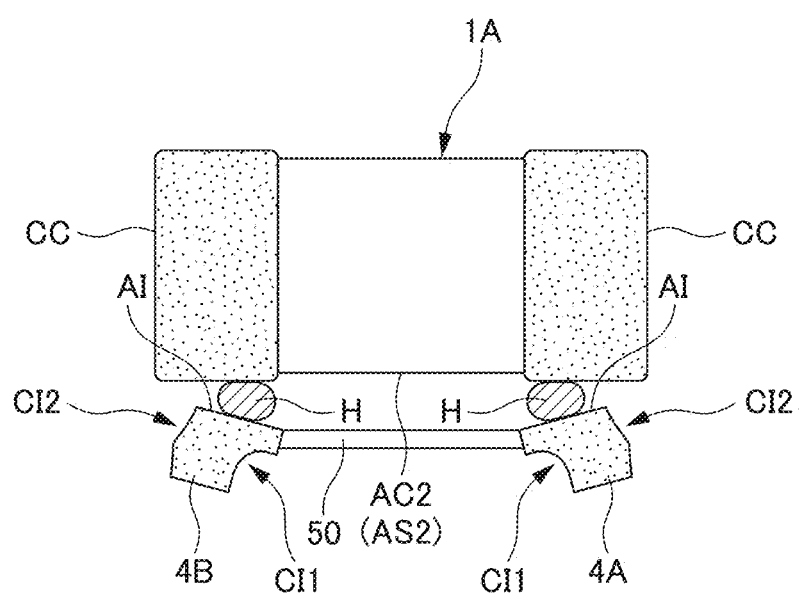
FIG. 11 is a diagram illustrating a multilayer ceramic capacitor 1 of a second modified example of a preferred embodiment of the present invention.

FIGS. 10 and 11 are diagrams for explaining modified examples, and show a mode in which the interposer main surface AI of the first interposer 4A and the interposer main surface AI of the second interposer 4B are not parallel or substantially parallel to each other, and the interposer main surfaces AI of the first interposer 4A and the second interposer 4B are sloped with respect to the capacitor main surface AC and the multilayer body main surface AS, respectively.

First Modified Example

FIG. 10 is a diagram showing a first modified example of a preferred embodiment of the present invention.

As shown in FIG. 10, in the first modified example, the first interposer 4A and the second interposer 4B include the interposer first main surface AI1 and the interposer second main surface AI2 opposite thereto, respectively, and the interposer first main surface AI1 and the interposer second main surface AI2 are parallel or substantially parallel to each other. Then, the interposer first main surface AI1 is sloped at a predetermined angle so as to approach the capacitor second main surface AC2 toward the opposed interposer on the other side. In other words, it has an inverted "V" shape. The predetermined angle is preferably about 10 degrees or less, for example.

Such a multilayer ceramic capacitor 1 can be manufactured by providing the solder H to be biased adjacent to the interposer second end surface CI2 on the interposer main surface AI when joining the interposer 4 and the capacitor main body 1A in the state of FIGS. 8A to 8H described above, for example.

Advantageous Effects

The interposer second main surface AI2 of the first interposer 4A, and the interposer second main surface AI2 of the second interposer 4B correspond to a mounting surface to the board of the multilayer ceramic capacitor 1.

Here, if this mounting surface is flat, when mounted on the board, there is a possibility that the multilayer ceramic capacitor 1 will slide laterally with respect to the board, such that positioning in the horizontal direction is difficult. This may lead to a case in which the mounting posture becomes unstable.

However, according to the present modified example, the interposer second main surface AI2 of the first interposer 4A and the interposer second main surface AI2 of the second interposer 4B defining and functioning as the mounting surfaces are sloped in opposite directions to each other so as to have an inverted "V" shape. Therefore, the multilayer ceramic capacitor 1 is difficult to move to the left and right, such that the mounting posture is stabilized by the self-alignment effect.

Second Modified Example

FIG. 11 is a diagram showing a second modified example of a preferred embodiment of the present invention.

As shown in FIG. 11, in the second modified example, the first interposer 4A and the second interposer 4B include the interposer first main surface AI1 and the interposer second main surface AI2 opposite thereto, respectively, and the interposer first main surface AI1 and the interposer second main surface AI2 are parallel or substantially parallel to each other. Then, the interposer first main surface AI1 is sloped at a predetermined angle so as to be spaced away from the capacitor second main surface AC2 toward the opposed interposer on the other side. In other words, it has a "V" shape. The predetermined angle is preferably about 10 degrees or less, for example.

Such a multilayer ceramic capacitor 1 can be manufactured by providing the solder H to be biased adjacent to the interposer first end surface CI1 on the interposer main surface AI when joining the interposer 4 and the capacitor main body 1A in the state of FIGS. 8A to 8H described above, for example.

Advantageous Effects

The interposer second main surface AI2 of the first interposer 4A, and the interposer second main surface AI2 of the second interposer 4B correspond to a mounting surface to the board of the multilayer ceramic capacitor 1.

Here, if the mounting surface is flat, when mounted on the board, there is a possibility that the multilayer ceramic capacitor 1 slides laterally with respect to the board, such that positioning in the horizontal direction is difficult. This may lead to a case in which the mounting posture becomes unstable.

However, according to the present modified example, the interposer second main surface AI2 of the first interposer 4A and the interposer second main surface AI2 of the second interposer 4B defining and functioning as the mounting surfaces are sloped in opposite directions to each other so as to have a "V" shape. Therefore, the multilayer ceramic capacitor 1 is difficult to move to the left and right, such that the mounting posture is stabilized by the self-alignment effect.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multilayer ceramic capacitor comprising:
a capacitor main body including a multilayer body including dielectric layers and internal electrode layers alternately laminated therein, and external electrodes each at one of two end surfaces of the multilayer body and connected to the internal electrode layers; and
two interposers on both sides in a length direction of a surface of the capacitor main body; wherein
when a distance between a side surface in a width direction of one of the interposers on one side in the length direction, and a side surface in the width direction of the capacitor main body is defined as X1, a distance between another side surface in the width direction of the one of the interposers on the one side in the length direction, and another side surface in the width direction of the capacitor main body is defined as X4, a distance between a side surface in the width direction of another one of the interposers on another side in the length direction, and the side surface in the width direction of the capacitor main body is defined as X2, and a distance between another side surface in the width direction of the another one of the interposers on the other side in the length direction, and the other side surface in the width direction of the capacitor main body is defined as X3, X2>X3 and X1>X4 are satisfied;
each of the two interposers is provided by a block portion;
the multilayer body further includes an inner layer portion including the dielectric layers and the internal electrode layers alternately laminated therein, outer layer portions each on one of both sides in a lamination direction of the inner layer portion, and side gap portions each on one of both sides in the width direction of the inner layer portion and the outer layer portions; and
the multilayer body satisfies one of the following configurations:
a dimension in the lamination direction of each of the outer layer portions is about 17 µm to about 23 µm,
a number of layers of each of the dielectric layers and the internal electrode layers is 350 to 380,
a deviation amount in the length direction of the internal electrode layers is about 45 µm to about 48 µm, and
a dimension in the width direction of each of the side gap portions is about 32 µm to about 42 µm;
a dimension in the lamination direction of each of the outer layer portions is about 35 µm to about 45 µm,
a number of layers of each of the dielectric layers and the internal electrode layers is 386 to 426,
a deviation amount in the length direction of the internal electrode layers is about 72 µm to about 78 µm, and
a dimension in the width direction of each of the side gap portions is about 52 µm to about 62 µm; or
a dimension in the lamination direction of each of the outer layer portions is about 52 µm to about 63 µm,
a number of layers of each of the dielectric layers and the internal electrode layers is 440 to 490,
a deviation amount in the length direction of the internal electrode layers is about 72 µm to about 85 µm, and
a dimension in the width direction of each of the side gap portions is about 63 µm to about 75 µm.

2. The multilayer ceramic capacitor according to claim 1, wherein X1/X4*0.9<X2/X3<X1/X4*1.1 is satisfied.

3. The multilayer ceramic capacitor according to claim 2, wherein at least one of X1, X2, X3, and X4 is about 20 µm or less.

4. The multilayer ceramic capacitor according to claim 1, wherein a thickness of each of the dielectric layers is about 2.0 µm or less.

5. The multilayer ceramic capacitor according to claim 1, wherein a thickness of each of the internal electrode layers is about 0.9 µm or less.

6. The multilayer ceramic capacitor according to claim 1, wherein
the external electrodes each include a copper electrode layer and a conductive resin layer in order from one of the two end surfaces of the multilayer body; and a gap is between the copper electrode layer and the conductive resin layer.

7. The multilayer ceramic capacitor according to claim 1, wherein the capacitor main body includes:
   a dimension in a lamination direction of about 0.62 mm to about 0.68 mm;
   a dimension in the length direction connecting the end surfaces of about 0.95 mm to about 1.15 mm; and
   a dimension in the width direction perpendicular or substantially perpendicular to the lamination direction and the length direction of about 0.62 mm to about 0.68 mm.

8. The multilayer ceramic capacitor according to claim 1, wherein
   a dimension in a lamination direction of each of the dielectric layers is about 0.98 µm to about 1.09 µm; and
   a dimension in the lamination direction of each of the internal electrode layers is about 0.62 µm to about 0.68 µm.

9. The multilayer ceramic capacitor according to claim 1, wherein
   the capacitor main body includes:
   a dimension in a lamination direction of about 0.89 mm to about 0.97 mm;
   a dimension in the length direction connecting the end surfaces of about 1.62 mm to about 1.72 mm; and
   a dimension in the width direction perpendicular or substantially perpendicular to the lamination direction and the length direction of about 0.88 mm to about 0.96 mm.

10. The multilayer ceramic capacitor according to claim 1, wherein
    a dimension in a lamination direction of each of the dielectric layers is about 1.35 µm to about 1.45 µm; and
    a dimension in the lamination direction of each of the internal electrode layers is about 0.67 µm to about 0.77 µm.

11. The multilayer ceramic capacitor according to claim 1, wherein
    the capacitor main body includes:
    a dimension in a lamination direction of about 1.32 mm to about 1.42 mm;
    a dimension in the length direction connecting the end surfaces of about 1.81 mm to about 2.01 mm; and
    a dimension in the width direction perpendicular or substantially perpendicular to the lamination direction and the length direction of about 1.29 mm to about 1.49 mm.

12. The multilayer ceramic capacitor according to claim 1, wherein
    a dimension in a lamination direction of each of the dielectric layers is about 1.88 µm to about 1.96 µm; and
    a dimension in the lamination direction of each of the internal electrode layers is about 0.73 µm to about 0.86 µm.

* * * * *